(12) United States Patent
Minn et al.

(10) Patent No.: US 12,218,397 B2
(45) Date of Patent: Feb. 4, 2025

(54) DEVICE AND METHOD FOR VARIABLE SIGNAL ATTENUATION IN WIRELESS COMMUNICATION SYSTEM

(71) Applicant: Samsung Electronics Co., Ltd., Gyeonggi-do (KR)

(72) Inventors: Donggyu Minn, Gyeonggi-do (KR); Youngchang Yoon, Gyeonggi-do (KR); Daehyun Kang, Gyeonggi-do (KR); Kyuhwan An, Gyeonggi-do (KR)

(73) Assignee: Samsung Electronics Co., Ltd (KR)

( * ) Notice: Subject to any disclaimer, the term of this patent is extended or adjusted under 35 U.S.C. 154(b) by 0 days.

(21) Appl. No.: 17/769,447

(22) PCT Filed: Oct. 16, 2020

(86) PCT No.: PCT/KR2020/014186
§ 371 (c)(1),
(2) Date: Apr. 15, 2022

(87) PCT Pub. No.: WO2021/075918
PCT Pub. Date: Apr. 22, 2021

(65) Prior Publication Data
US 2024/0128625 A1 Apr. 18, 2024

(30) Foreign Application Priority Data
Oct. 16, 2019 (KR) .................. 10-2019-0128464

(51) Int. Cl.
*H01P 1/22* (2006.01)
*H03H 11/28* (2006.01)
*H03H 11/40* (2006.01)

(52) U.S. Cl.
CPC ............ *H01P 1/227* (2013.01); *H03H 11/28* (2013.01); *H03H 11/40* (2013.01)

(58) Field of Classification Search
CPC .. H01P 1/227; H01P 1/22; H01P 1/225; H01P 5/187; H01P 5/185; H01P 5/184;
(Continued)

(56) References Cited

U.S. PATENT DOCUMENTS

| 6,414,565 B1 | 7/2002 | Tanaka et al. |
| 9,419,662 B2 | 8/2016 | Kacynski et al. |

(Continued)

FOREIGN PATENT DOCUMENTS

| EP | 2 544 369 | 1/2013 | |
| JP | H08321704 A | * 3/1996 | ............. H01P 1/22 |

(Continued)

OTHER PUBLICATIONS

PCT/ISA/210 Search Report issued on PCT/KR2020/014186, Jan. 26, 2021, pp. 5.
(Continued)

*Primary Examiner* — Stephen E. Jones
(74) *Attorney, Agent, or Firm* — The Farrell Law Firm, P.C.

(57) ABSTRACT

The present disclosure relates to a 5th generation (5G) or pre-5G communication system for supporting a higher data transmission rate than a 4th generation (4G) communication system such as Long-Term Evolution (LTE). The present disclosure provides a device for variable signal attenuation equipped in a stack-up structure inside an RFIC. The device for signal attenuation comprises: a first transmission line positioned on a first layer inside the RFIC; a second transmission line positioned on a second layer, which is adjacent to the first layer, and electromagnetically coupled to the first transmission line; and a control unit. The first transmission line comprises an impedance control unit on one side. The control unit can variably control the impedance control unit.

6 Claims, 11 Drawing Sheets

(58) Field of Classification Search
CPC .. H01P 5/18; H01P 5/12; H03H 11/28; H03H 11/40
See application file for complete search history.

(56) References Cited

U.S. PATENT DOCUMENTS

| | | | |
|---|---|---|---|
| 9,590,591 | B1 | 3/2017 | Ashry Othman |
| 2002/0057137 | A1* | 5/2002 | Marketkar ........... H05K 1/0239 333/24 R |
| 2004/0119558 | A1 | 6/2004 | Chaki |
| 2004/0239440 | A1* | 12/2004 | Nyberg ................ H03H 11/245 333/81 R |
| 2011/0148501 | A1 | 6/2011 | Granger-Jones et al. |
| 2011/0298569 | A1 | 12/2011 | Tzuang et al. |
| 2014/0011461 | A1 | 1/2014 | Bakalski et al. |
| 2017/0250723 | A1 | 8/2017 | Srirattana |
| 2018/0175828 | A1 | 6/2018 | Ashry Othman et al. |
| 2019/0123707 | A1 | 4/2019 | Bergsma |
| 2019/0140688 | A1 | 5/2019 | Tombak et al. |

FOREIGN PATENT DOCUMENTS

| | | |
|---|---|---|
| KR | 10-2004-0054478 | 6/2004 |
| KR | 10-1625265 | 5/2016 |
| KR | 1020180132932 | 12/2018 |
| KR | 10-2019-0051842 | 5/2019 |

OTHER PUBLICATIONS

PCT/ISA/237 Written Opinion issued on PCT/KR2020/014186, Jan. 26, 2021, pp. 3.
European Search Report dated Nov. 21, 2022 issued in counterpart application No. 20877033.9-1205, 7 pages.
Korean Office Action dated Jan. 16, 2024 issued in counterpart application No. 10-2019-0128464, 9 pages.
Indian Examination Report dated Feb. 26, 2024 issued in counterpart application No. 202217027662, 6 pages.
European Search Report dated Apr. 11, 2024 issued in counterpart application No. 20877033.9-1201, 6 pages.
KR Notice of Patent Grant dated Jun. 5, 2024 issued in counterpart application No. 10-2019-0128464, 6 pages.

* cited by examiner

DEVICE AND METHOD FOR VARIABLE SIGNAL ATTENUATION IN WIRELESS COMMUNICATION SYSTEM

PRIORITY

This application is a National Phase Entry of International Application No. PCT/KR2020/014186, which was filed on Oct. 16, 2020, and claims priority to Korean Patent Applications No. 10-2019-0128464, filed in the Korean Intellectual Property Office on Oct. 16, 2019, the entire content of each of which is incorporated herein by reference.

TECHNICAL FIELD

The disclosure relates generally to wireless communication systems and, more particularly, to a device and a method for variable signal attenuation in wireless communication systems.

BACKGROUND ART

To meet the demand for wireless data traffic having increased since deployment of 4th generation (4G) communication systems, efforts have been made to develop an improved 5th generation (5G) or pre-5G communication system. Therefore, the 5G or pre-5G communication system is also called a "beyond 4G network" communication system or a "post long term evolution (post LTE)" system.

The 5G communication system is considered to be implemented in ultra-higher frequency (mmWave) bands (e.g., 60 GHz bands) so as to accomplish higher data rates. To decrease the propagation loss and increase the transmission distance of the radio waves in the ultra-higher frequency bands, beamforming, massive multiple-input multiple-output (massive MIMO), full dimensional MIMO (FD-MIMO), array antenna, analog beam forming, large scale antenna techniques are discussed in 5G communication systems.

In addition, in 5G communication systems, technical development for system network improvement is under way based on advanced small cells, cloud radio access networks (cloud RANs), ultra-dense networks, device-to-device (D2D) communication, wireless backhaul, moving network, cooperative communication, coordinated multi-points (CoMP), reception-end interference cancellation and the like.

In the 5G system, hybrid frequency shift keying and quadrature amplitude modulation (FOAM) and sliding window superposition coding (SWSC) as an advanced coding modulation (ACM) scheme, and filter bank multi carrier (FBMC), non-orthogonal multiple access (NOMA), and sparse code multiple access (SCMA) as an advanced access technology have also been developed.

As wireless communication systems such as 5G systems develop, it is expected to provide various services. Accordingly, there is a need for a method of effectively providing these services.

In order to secure a dynamic range of input/output power required in the 5G system operating conditions, a power amplifier block in a radio frequency integrated circuit (RFIC) is designed to change a gain mode. However, securing optimal linearity in each gain mode while embedding multiple gain modes causes many difficulties for design. A method to solve this problem is that the power amplifier secures the minimum gain mode and that the magnitude of the final output power is adjusted using an attenuator having various attenuation mode functions provided therein. Accordingly, the attenuator is required to maintain the linearity of the power amplifier signal, and uses an inductor to minimize the loss in the minimum attenuation mode and to control the effect of parasitic capacitance in operation of a transistor, but the inductor usually require a large space compared to other devices. Therefore, there is a continuous need for a si attenuator capable of securing both spatial efficiency and optimal linearity.

DISCLOSURE OF INVENTION

Technical Problem

Based on the above discussion, the disclosure provides an attenuation device and a method for securing the efficiency of a mounting space in a wireless communication system.

Advantageous effects Obtainable from the disclosure may not be limited to the above-mentioned effects, and other effects which are not mentioned may be clearly understood, through the following descriptions, by those skilled in the art to which the disclosure pertains.

Solution to Problem

According to various embodiments of the disclosure, a signal attenuation device built in a stack-up structure in a radio frequency integrated circuit (RFIC) in a wireless communication system may include a first transmission line positioned in a first layer in the MC, a second transmission line positioned in a second layer adjacent to the first layer and electromagnetically, coupled to the first transmission line, and a control unit, wherein the first transmission line includes an impedance control unit on one side thereof, and wherein the control unit variably controls the impedance control unit.

According to another aspect of the disclosure, a signal attenuation method using a stack-up structure in an RFIC in a wireless communication system may include electromagnetically coupling two adjacent layers in the RFIC and controlling an impedance value of each of the two layers.

Advantageous Effects of Invention

A device and a method according to various embodiments of the disclosure make it possible to efficiently secure a mounting space in which an attenuation device is embedded.

Advantageous effects Obtainable from the disclosure may not be limited to the above-mentioned effects, and other effects which are not mentioned may be clearly understood, through the following descriptions, by those skilled in the art to which the disclosure pertains.

BEST MODE FOR CARRYING OUT THE INVENTION

The terms used in the disclosure are only used to describe specific embodiments, and are not intended to limit the disclosure. A singular expression may include a plural expression unless they are definitely different in a context. Unless defined otherwise, all terms used herein, including technical and scientific terms, have the same meaning as those commonly understood by a person skilled in the art to which the disclosure pertains. Such terms as those defined in a generally used dictionary may be interpreted to have the meanings equal to the contextual meanings in the relevant field of art, and are not to be interpreted to have ideal or excessively formal meanings unless clearly defined in the disclosure. In some cases, even the term defined in the disclosure should not be interpreted to exclude embodiments of the disclosure.

Hereinafter, various embodiments of the disclosure will be described based on an approach of hardware. However, various embodiments of the disclosure include a technology that uses both hardware and software, and thus the various embodiments of the disclosure may not exclude the perspective of software.

Hereinafter, the disclosure relates to a device and a method for variable signal attenuation in a wireless communication system. Specifically, the disclosure describes a technique for securing the efficiency of a mounting space in a wireless communication system.

Terms that refer to signals, terms that refer to channels, terms that refer to control information, terms that refer to network entities, and terms that refer to elements of a device, which are used in the following description, are provided by way of example for convenience of description. Accordingly, the disclosure is not limited to the terms described below, and other terms having equivalent technical meanings may be used.

In addition, in the disclosure, although an expression "more than" or "less than" is used to determine whether a specific condition is satisfied or fulfilled, this is only a description to express an example, and is not intended to exclude a description of "greater than or equal to" or "less than or equal to". Conditions described as "greater than or equal to" may be replaced with "more than", conditions described as "less than or equal to" may be replaced with "less than", and conditions described as "greater than or equal to and less than" may be replaced with "more than and less than or equal to".

In addition, although the disclosure describes various embodiments using terms used in some communication standards (e.g., 3rd generation partnership project (3GPP)), this is only an example for description. Various embodiments of the disclosure may be easily modified and applied to other communication systems.

Figure 1:
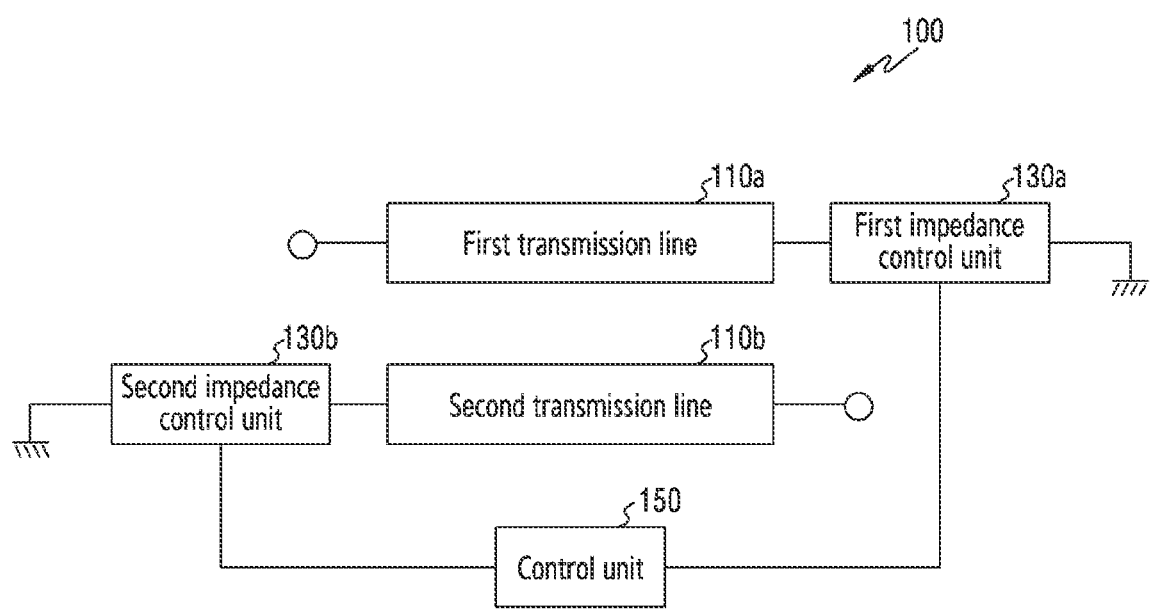
FIG. 1 illustrates the configuration of a signal attenuation device according to various embodiments of the disclosure.

FIG. 1 illustrates the configuration of a signal attenuation device according to various embodiments of the disclosure.

Referring to FIG. 1, a signal attenuation device 100 illustrates transmission lines 110*a* and 110*b* and impedance control units 130*a* and 130*b*.

At least two transmission lines 110*a* and 110*b* are disposed side by side at different heights. More specifically, assuming a structure in which two transmission lines are disposed, the transmission line disposed in the upper portion may be referred to as a first transmission line 110*a*, and the transmission line disposed in the lower portion may be referred to as a second transmission line 110*b*. Impedance control units 130*a* and 130*b* are respectively connected to one ends of the transmission lines. The impedance control unit connected to the first transmission line 110*a* may be referred to as a first impedance control unit 130*a*, and the impedance control unit connected to the second transmission line 110*b* may be referred to as a second impedance control unit 130*b*. There may be a signal port through which current flows in at one end of the first transmission line 110*a*.

The impedance control unit has a variable impedance value in a certain range. More specifically, the impedance control unit may be electrically connected to the transmission line so as to adjust the magnitude of a current flowing through the transmission line. The first impedance control unit 130*a* may adjust the impedance of the first transmission line 110*a*, and the second impedance control unit 130*b* may adjust the impedance of the second transmission line 110*b*. The first impedance control unit 130*a* and the second impedance control unit 130*b* may be controlled independently, or may be controlled interdependently according to a predetermined condition or user's intention. The impedance control unit is controlled by a control unit. The control unit may be a separate configuration from the impedance control unit, or may be a configuration included in the impedance control unit. In the case where the control unit is a separate configuration from the impedance control unit, the control unit may be connected to all of a plurality of impedance control units. In this case, the control unit and the respective impedance control units are electrically connected.

One side of each impedance control unit may be grounded. More specifically, in the case where two impedance control units are provided, each of the impedance control units may be connected to a respective one of two transmission lines, and the impedance control units may form a symmetric structure to each other with respect to the transmission lines. When the first impedance control unit 130*a*, is connected to one end of the first transmission line 110*a* positioned in the upper layer, the second impedance control unit 130*b* may be connected to the opposite end of the second transmission line 110*b* positioned in the lower layer. A first port through which current flows in and out may be provided at the opposite end of the first transmission line 110*a*, and a second port through which current flows in and out may be provided at one end of the second transmission line 110*b*.

The magnitudes of currents flowing through the first transmission line 110*a* and the second transmission line 110*b* may be interdependent.

Figure 2:
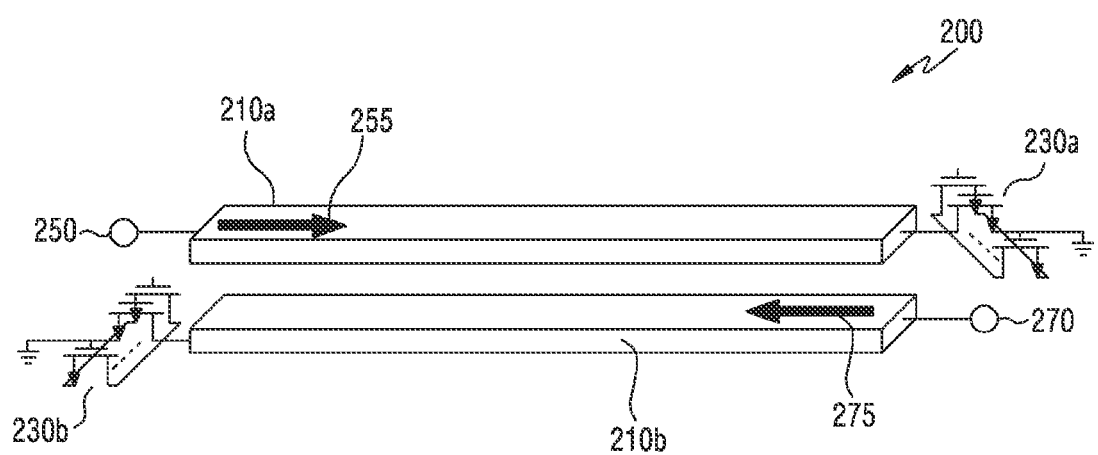
FIG. 2 illustrates the operation of a signal attenuation device according to various embodiments of the disclosure.

FIG. 2 illustrates the operation of a signal attenuation device 200 according to various embodiments of the disclosure. Referring to FIG. 2, signal ports 250 and 270 may be provided at one ends of the transmission lines 210a and 210, and current may flow in and out through the signal ports. The signal port provided in a first transmission line 210a may be defined as a first port 250, and the signal port provided in a second transmission line 210b may be defined as a second port 270.

The transmission lines 210a and 210b forming two adjacent layers may be electromagnetically coupled to each other. Here, two adjacent layers indicate two layers in which other layers do not exist in the space between the layers. Alternatively, as will be described later, it may indicate the case in which other layers related to a signal do not exist in the space between the corresponding layers.

At least one transistor 230a may be connected to one end of the upper layer transmission line 210a among the transmission lines forming the two adjacent layers, and a signal port 250 may be provided at the opposite end thereof. The transistor may be included in the above-described impedance control unit to induce the impedance control unit to have a variable impedance value. A current 255 input from the signal port may flow toward the transistor 230a positioned at the opposite end thereof, and in this process, the transmission lines forming the two layers may be in an electromagnetically coupled state.

At least one transistor 230b may be connected to one end of the lower layer transmission line 210b among the transmission lines forming the two adjacent layers, and a signal port 270 may be provided at the opposite end thereof. The transistor 230b may be included in the impedance control unit to induce the impedance control unit to have a variable impedance value. An induced current 275 may flow through the lower layer signal port 270 according to the flow of the current 255 input from the upper layer signal port 250, and the induced current 275 may flow from the lower layer signal port 270 to the transistor 230b. Under this structure, the respective signal ports and the respective transistors are symmetrically positioned.

In the case where a plurality of transistors is included in the impedance control unit, the plurality of transistors may be connected in parallel. The control unit electrically connected to the impedance control unit may independently control each of the plurality of transistors. The total impedance value of the impedance control unit changes depending on the control of the transistors. Impedance may be defined as resistance under certain conditions. When the resistance is increased or reduced by the control of the transistor, the signal may be attenuated. More specifically, as the number of transistors in the off state increases, the total impedance value of the impedance control unit increases, which induces signal attenuation. If the number of transistors in the on state increases, the total impedance value is reduced, and thus the second port 270 approaches the state in which the maximum power is transmitted. Switches of the plurality, of transistors may be operated by controlling the control unit according to predetermined conditions or user's intention, thereby attenuating the signal of the power amplifier in the RFIC or adjusting the degree of attenuation of the signal. In particular, in a position where securing linearity is important, if the factors (PA, etc.) that contribute decisively to final output linearity are optimally configured, and if an attenuator preceding the same is able to determine an appropriate input level, the linearity of the final RFIC output may be optimally maintained for various input levels.

Figure 3:
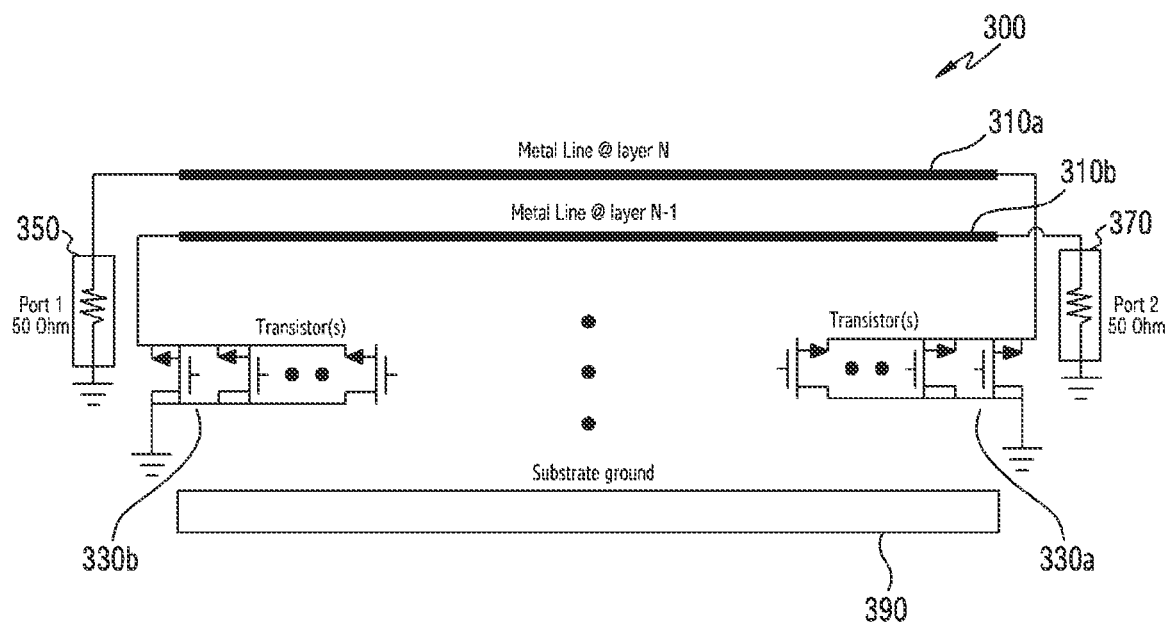
FIG. 3 is a cross-sectional view of a signal attenuation device according to various embodiments of the disclosure.

FIG. 3 is a cross-sectional view of a signal attenuation device according to various embodiments of the disclosure. FIG. 3 illustrates transmission lines 310a and 310b and impedance control units 330a and 330b as configurations of a signal attenuation device 300 used in a wireless communication system.

Referring to FIG. 3, the transmission line may have a structure in which a plurality of metal lines forms layers. The plurality of metal lines may form a plurality of layers, and the respective layers may be divided into a first layer 310a, a second layer 310b, and the like. The first layer 310a and the second layer 310b may be understood to indicate adjacent layers. Each transmission line may be positioned in a corresponding layer. In this case, two adjacent transmission lines may function as a signal attenuation device 300, and when the impedance control unit 330a is provided at one end of the upper layer transmission line 310a, the impedance control unit 330b may be provided at the opposite end of the lower layer transmission line 310b symmetrically with the upper layer. Both impedance control units 330a and 330b have a variable total impedance according to driving of transistors included therein. More specifically, respective transistors included in the impedance control unit may be connected in parallel and switched individually, and switching thereof may be performed by a separate control unit electrically connected to the impedance control unit. The metal lines constituting the transmission line are a part of a stack-up structure used in the RFIC process, and there may be two or more metal lines, and a third transmission line related to the signal is not provided between a substrate ground 390 and the lower layer transmission line 310b. The impedance control units 330a and 330b configured by transistors may be controlled in its size depending on the number of attenuation modes to be implemented and the degree thereof, and the impedance changes according to individual or collective switching of transistors connected in parallel.

The first transmission line 310a and the second transmission line 310b, which are disposed adjacent to each other, and the impedance control units 330a and 330b, which have a symmetric structure, form a coupled line transformer. Therefore, the current flowing in from a first port 350 provided at one end of the first transmission line 310a may cause an induced current flowing through a second port 370 provided at one end of the second transmission line 310b, and the magnitude of the induced current may be attenuated corresponding to the magnitude of the impedance that changes by the impedance control units 330a and 330b. That is, by symmetrically providing the impedance control units including transistors on one side of the metal line, it is possible to use the stack-up structure used in the RFIC process as a transformer. Under such a structure, the user may adjust the magnitude of the final output power as needed by switching on/off each transistor included in the impedance control unit. For example, if the number of transistors in the off state increases, the total impedance value of the impedance control unit increases, and the induced current decreases. A decrease in the induced current leads to a decrease in the magnitude of the final output power. The transistors connected in parallel and switched individually or collectively may linearly attenuate the final output power amplifier signals. In addition, since all transistors operate in the on state when transmitting the maximum power, this structure is particularly easy to secure linearity.

Figure 4:
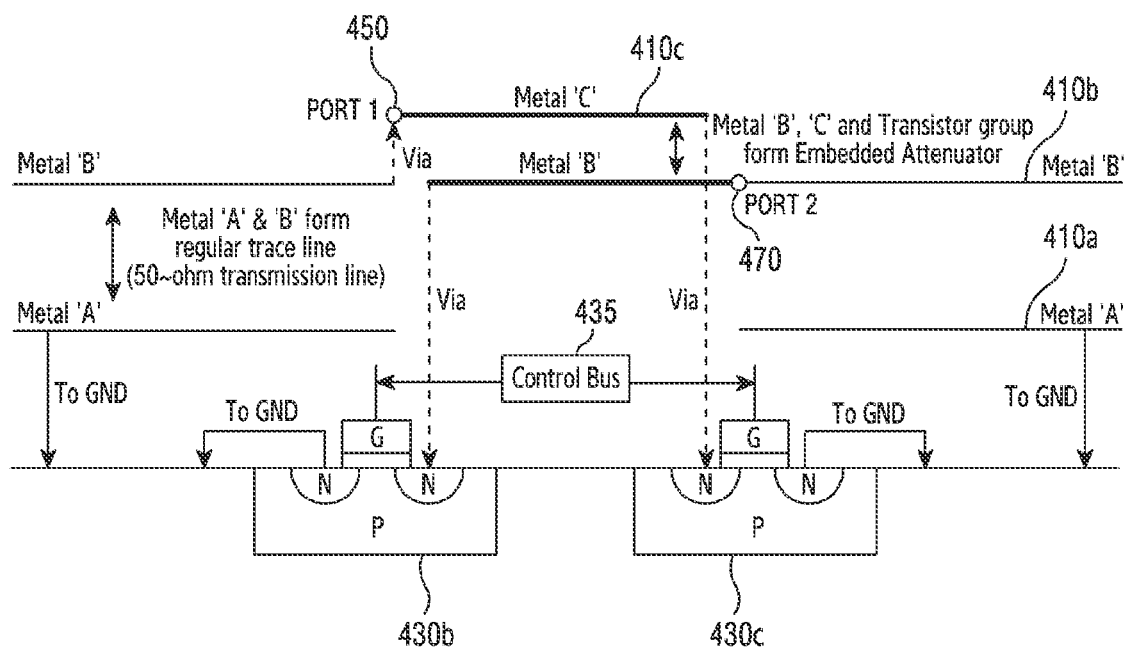
FIG. 4 illustrates another cross-sectional view of a signal attenuation device according to various embodiments of the disclosure.

FIG. 4 illustrates another cross-sectional view of a signal attenuation device according to various embodiments of the disclosure. FIG. 4 illustrates a metal line structure of a coupled line transformer constituting a signal attenuation device of the disclosure in more detail.

Metal lines 410a and 410b that construct a stack-up structure used in the RFIC process and form a regular trace line may be arbitrarily specified as A and B, and a coupled line transformer performing an attenuation function may be defined using the same. In this case, the signal attenuation device of the disclosure may further include a separate metal line C 410c. One side of the metal line C 410c is connected to the metal line B 410b, and the opposite side thereof is connected to a transistor 430c A connection point to which the metal line B 410b and the metal line C 410c are connected may be defined as a first port 450. Accordingly, a current flowing in from one side of the metal line B 410b is transmitted to the transistor through the metal line C 410c.

A transistor 430b is connected to one side of the metal line B 410b. The transistors 430b and 430c connected to the metal line C 410c and the metal line B 410b have a symmetrical structure, and two adjacent metal lines B and C function as a coupled line transformer. Therefore, when a current flows from one side of the metal line B 410b to the metal line C 410c via the first port 450, an induced current flows toward a second port 470 in the metal line B 410b of the lower layer. In this process, current attenuation occurs according to switching of the transistor. The transistors respectively connected to the metal lines B and C may be embedded in a substrate as shown in FIG. 4. Both transistors may exchange data or signals with each other through a control bus 435, and may be switched individually or collectively by interworking with each other. The control bus 435 may be a configuration included in the control unit. Although only one transistor is shown in each of the metal lines B and C in FIG. 4, it should be understood to indicate a parallel transistor group. One side of the transistor may be electrically connected to the metal line B, and the opposite side thereof may be grounded. Likewise, one side of the transistor may be electrically connected to the metal line C, and the opposite side thereof may be grounded. In addition, the metal line A forming a regular trace line may also be grounded. In other words, the metal line B, the metal line C, and the transistor group may configure one built-in signal attenuation device. Circuit matching possible by adjusting the length (inductance) of the metal line, the distance between the metal line 13 and the metal line C, and the area (capacitance) of the metal line.

Figure 5:
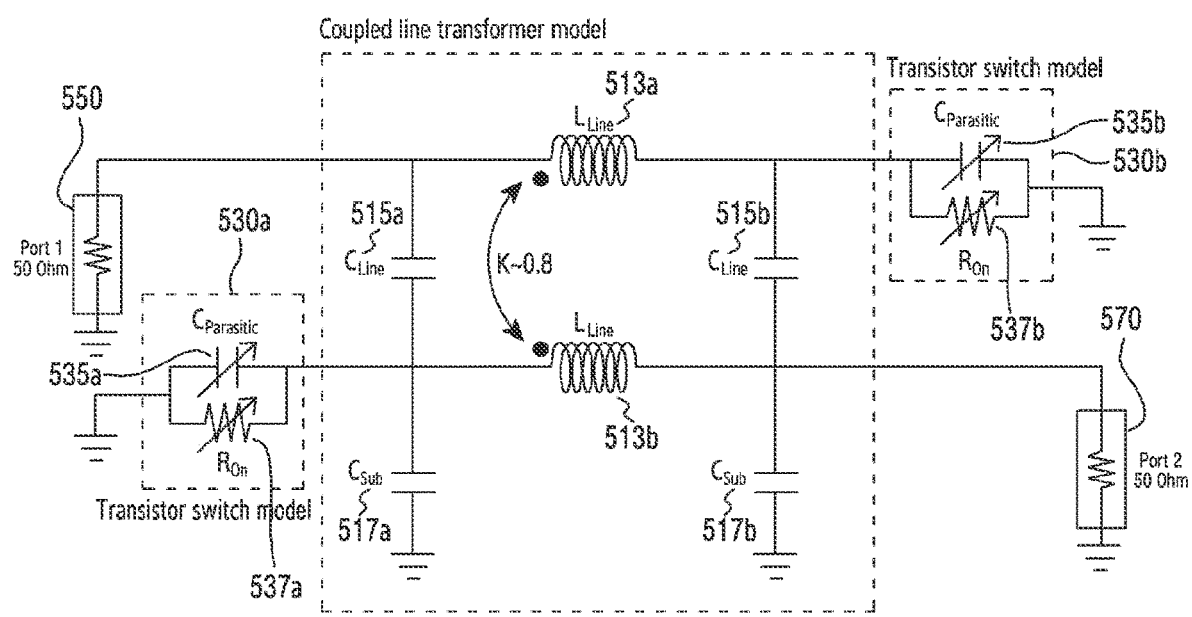
FIG. 5 illustrates an equivalent circuit of a signal attenuation device according to various embodiments of the disclosure.

FIG. 5 illustrates an equivalent circuit of a signal attenuation device according to various embodiments of the disclosure. FIG. 5 illustrates an equivalent circuit including inductors 513a and 513b and capacitors 515a, 515b, 517a, and 517b implemented by a coupled line transformer of a signal attenuation device of the disclosure.

Two adjacent metal lines operate as an inductor $L_{Line}$, and the metal lines forming two layers overlap each other at regular intervals, thereby forming a coupling factor K at a high level. Thus, two adjacent metal lines form a magnetically coupled transformer. A circuit including a transistor is affected by to parasitic capacitances 535a and 535b when operating at a high frequency, and an inductor is required in the circuit to offset this. A coupled line transformer may be used to control the effect of parasitic capacitance by replacing the function of the inductor without an inductor that requires a large space compared to other devices. In the case of an attenuator using a coupled line transformer, an inductor for resonating out the off capacitance of a transistor is unnecessary, so there is a gain in the mounting space, More specifically, in the equivalent circuit shown in FIG. 4, the coupled line transformer model itself includes configurations 513a and 513b that play the role of an inductor, so a separate inductor device is not required to be included in the circuit.

The respective transmission lines may act as inductors 513a and 513b, and have a high coupling factor K due to two layers in a stack-up structure disposed vertically adjacent. Approximately, the coupling factor K may be determined to be around 0.8.

In addition, the equivalent model of the coupled line transformer may form capacitances 515a and 515b between the lines connecting both ends of the metal line ($C_{Line}$) capacitances 517a and 517b may also be generated between the lower one of the two metal lines and the ground substrate ($C_{Sub}$), and may be expressed at both ends of the line as an equivalent model. M transistors positioned at both ends of the line may be represented by parasitic capacitance ($C_{Parasitic}$) 535a or 535b and on-resistance ($R_{on}$) 537a or 537b, and values thereof are determined by the number and sizes of the transistors used. $R_{on}$ 537a or 537b controls the on/off state of each transistor according to the attenuation mode, and a value thereof changes. Transmission lines operating as an inductor by the coupled line transformer may control the effect of parasitic capacitance 535a or 535b generated by the transistors. In addition, the parasitic capacitance 535a or 535b generated by the line and the transistor, and the inductance of the metal line operating as the inductor 513a or 513b may be adjusted by changing the width and length of the metal line and the spacing between the adjacent metal line layers.

Figure 6:
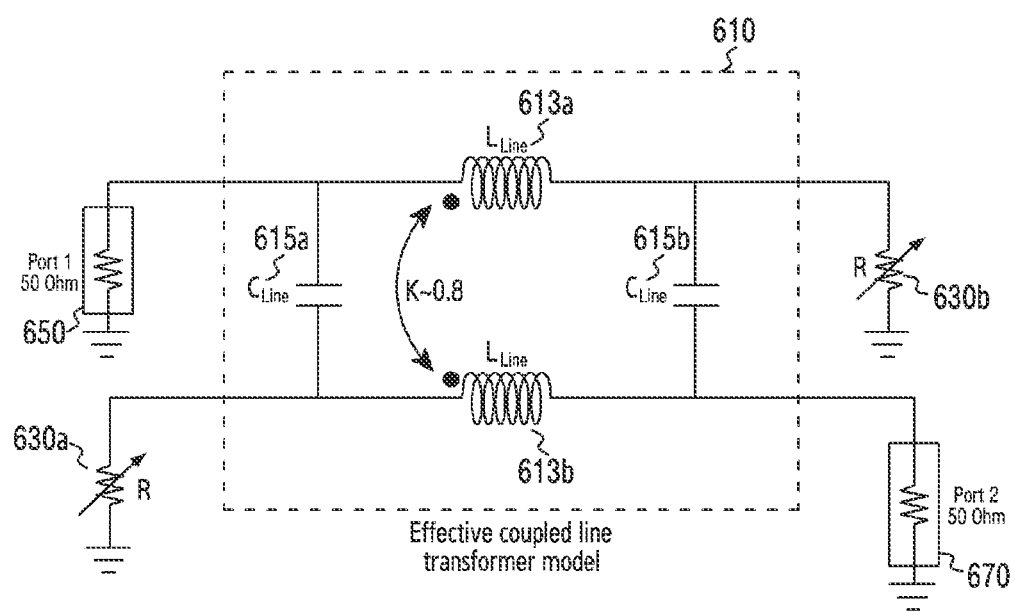
FIG. 6 schematically illustrates an equivalent circuit of a signal attenuation device according to various embodiments of the disclosure.

FIG. 6 schematically illustrates an equivalent circuit of a signal attenuation device according to various embodiments of the disclosure. FIG. 6 illustrates a factor that primarily affects the operation of an actual signal attenuation device in the equivalent circuit in FIG. 5.

The equivalent circuit may be configured as main configurations $L_{Line}$ 613a and 613b and $C_{Line}$ 615a and 615b by considering that $C_{Parasitic}$ and $C_{Sub}$ of FIG. 5 are very small values, compared to other device values, and thus their influence on the overall circuit operation is relatively low. The equivalent circuit configured in this way may be defined as an effective coupled line transformer model 610. Variable resistors R 630a and 630b may be driven by selectively turning on and off several transistors connected in parallel.

$C_{Line}$ 615a and 615b and $L_{Line}$ 613a and 613b may be set to desired values by adjusting the width and length of the metal line, thereby realizing the operation at a desired frequency. The minimum attenuation mode is implemented by configuring all transistors in the on state and minimizing the values R 630a and 630b, Signal attenuation is made possible by reducing the ratio of transistors in the on state to several transistors connected in parallel. This increases the resistance component of the circuit, resulting in a decrease in the current induced from a first port 650 to a second port 670.

In addition, when the coupled line transformer transmits a signal of the maximum power, since all transistors are in the on state, nonlinear operation caused by the transistor in the off state may be prevented, thereby easily securing linearity. In addition, the values R 630a and 630b are maintained at a relatively small level, compared to the impedance caused by the parasitic capacitance provided in parallel (see FIG. 5) even in the signal attenuation mode, it is possible to minimize the occurrence of nonlinearity factors caused by off-transistors, thereby maintaining high linearity.

Figure 7:
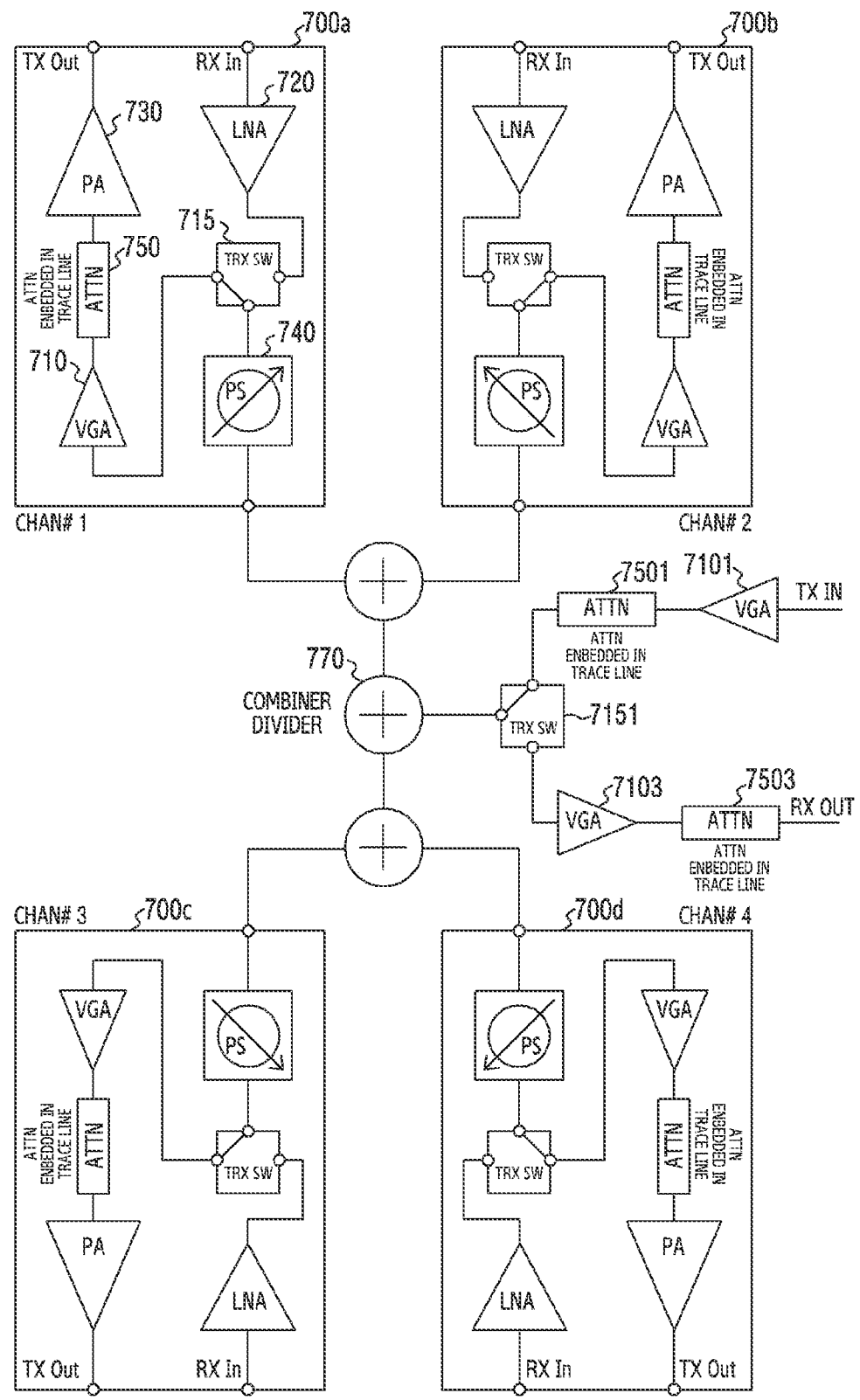
FIG. 7 is a block diagram of a radio frequency integrated circuit (RFIC) to which a signal attenuation device is applied according to various embodiments of the disclosure.

FIG. 7 is a block diagram of an RFIC to which a signal attenuation device is applied according to various embodiments of the disclosure. FIG. 7 shows an example of using a signal attenuation device having transmission lines embedded therein in a 4-chain radio frequency (RF) transceiver structure.

Referring to FIG. 7, the signal attenuation device may be used in place of an existing transmission line. More specifically, since the transmission line connecting a power amplifier (PA) 730 and a variable gain amplifier (VGA) 710 may be used as it is, a separate space is not required, thereby improving the efficiency of using a space. It is also applied to each chain 700 or common part 770 in the four chains to enable fine level tuning of the output power between chains or of the entire system.

A built-in signal attenuation device shown in chain 1 (700*a*) will be described below. A signal input through a phase shifter (PS) 740 passes through a transmit/receive (TRX) switch 715 to arrive at the VGA 710, and the signal passing through the VGA 710 is attenuated by a signal attenuation device, that is, an attenuator (ATTN) 750, by a specified gain mode and is then transmitted to the PA 730, The signal attenuated while maintaining the linearity by the attenuator is sufficiently amplified and transmitted by the PA 710, Chain 2 (700*b*) to chain 4 (700*d*) also operate in the same manner as chain 1 (700*a*).

However, the above embodiment does not limit the arrangement structure of the attenuator, and the attenuator may be applied to a necessary position in the circuit without any limit as long as it is embedded in the transmission line.

The above description is also applied to the blocks shown in chain 2 (700*b*) to chain 4 (700*d*). It is also applied to a common part, as well as to each chain, enabling fine-level tuning of the overall system output power. Accordingly, it is possible to improve the quality of beamforming that needs to control the output of a plurality of chains.

Figure 8:
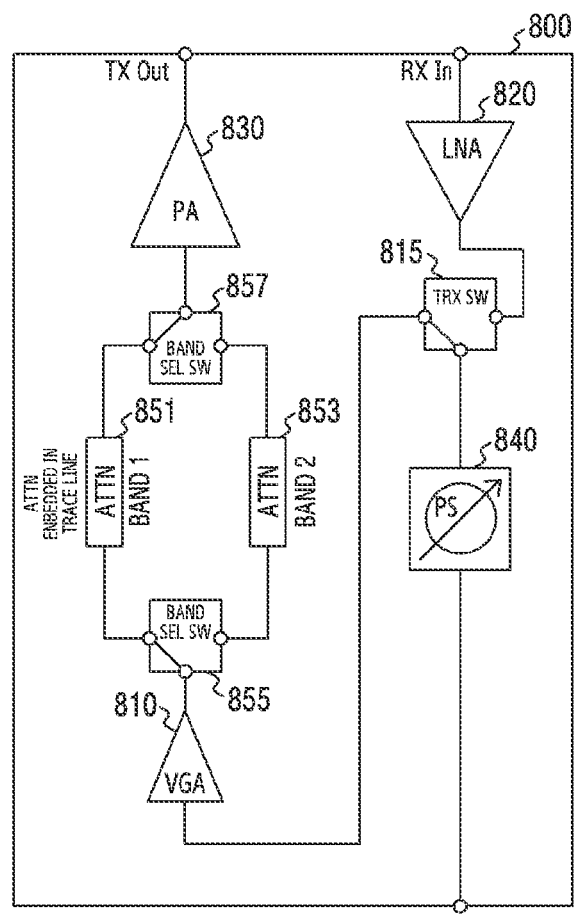
FIG. 8 illustrates another example in which a signal attenuation device is applied to an RFIC according to various embodiments of the disclosure.

FIG. 8 illustrates another example in which a signal attenuation device is applied to an RFIC: according to various embodiments of the disclosure. FIG. 8 illustrates a structure of selectively using a signal attenuation device designed to be suitable for a specific band frequency.

It is necessary to use an optimal attenuation device for each band frequency, and embedding all of a plurality of attenuation devices in a circuit may increase inefficiency in space utilization. The structure disclosed in FIG. 8 selectively implements an optimal attenuation function by switching.

For example, when using a first band frequency, in order to perform an attenuation function while maintaining optimal linearity, a transmission line must be connected to a first attenuator designed to be most suitable for the first band frequency. Accordingly, band selection switches 857 and 855 perform switching such that a first attenuator 851 is connected to the transmission line. Similarly, in the case of using a first band frequency, the band selection switches 857 and 855 perform switching such that the transmission line is connected to a second attenuator 853 designed to be most suitable for the second band frequency. Although only two attenuators of different bands are shown in FIG. 8, it will be possible to further install more attenuators as necessary. Adding a plurality of attenuators in this structure may contribute to minimizing an increase in the circuit area in that the space occupied by the transistor is very small and the transmission line is embedded.

In addition, two band selection switches may be provided at both ends of the attenuator embedded in the transmission line, or may be provided only at one end thereof. The band selection switch may be connected to a separately provided control device and may be driven according to a control command, and may be driven by a control unit that controls the impedance control unit.

Figure 9:
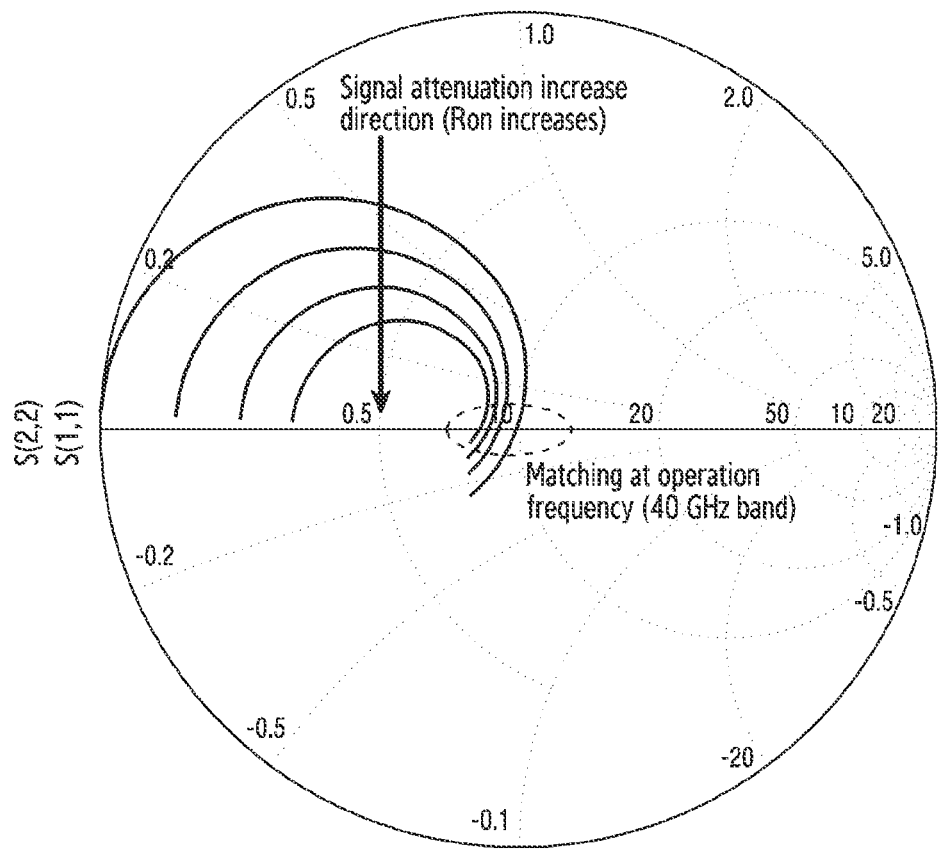
FIG. 9 illustrates a change in ohm matching depending on a change in an attenuation mode in a signal attenuation device according to various embodiments of the disclosure.

FIG. 9 illustrates a change in ohm matching depending on a change in an attenuation mode in a signal attenuation device according to various embodiments of the disclosure. Referring to FIG. 5, based on the case in which a resistor element of 50 ohms is connected to each of the first port and the second port in the signal attenuation device of the disclosure, even if the attenuation mode is changed, matching at an operation frequency is confirmed to be maintained. This is due to using a trace line existing in the stack-up structure in an RFIC as a coupled line transformer. In other words, this is due to the fact that most of 50 ohm-matching is determined by lines drawn with a width, length, and spacing suitable for operation at the operation frequency and that the parasitic capacitance ($C_{Parasitic}$, FIG. 5) according to switching on/off of the transistor and the total value of $R_{on}$ do not significantly affect the matching.

More specifically, as the on/off state of the transistor is changed according to the control of the impedance control unit, the resistance value $R_{on}$ increases, and thus it may be confirmed that even if signal attenuation increases, the matching does not significantly fall outside of the operation frequency band.

Figure 10:
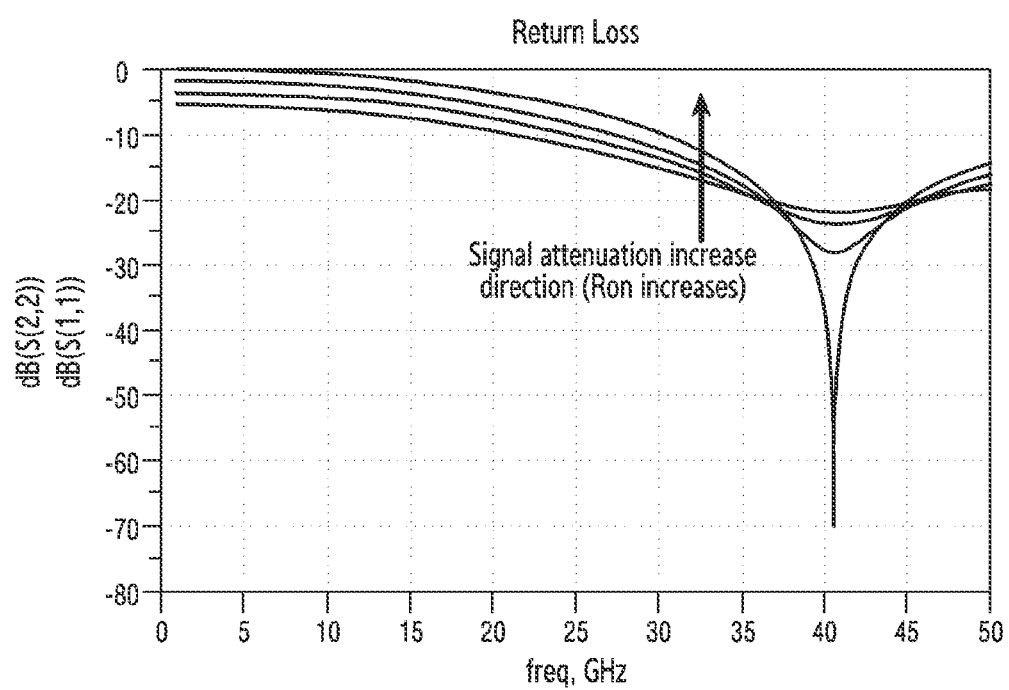
FIG. 10 is a graph illustrating a matching change for each mode in a signal attenuation device according to various embodiments of the disclosure.

FIG. 10 is a graph showing a matching change for each mode in a signal attenuation device according to various embodiments of the disclosure. FIG. 10 shows matching for each mode when the operation frequency is set to 40 GHz. Through this, it may be seen that even if the magnitude of the resistor $R_{on}$ changes depending on the on/off state of the transistor, the optimum point of matching remains at around 40 GHz.

Figure 11:
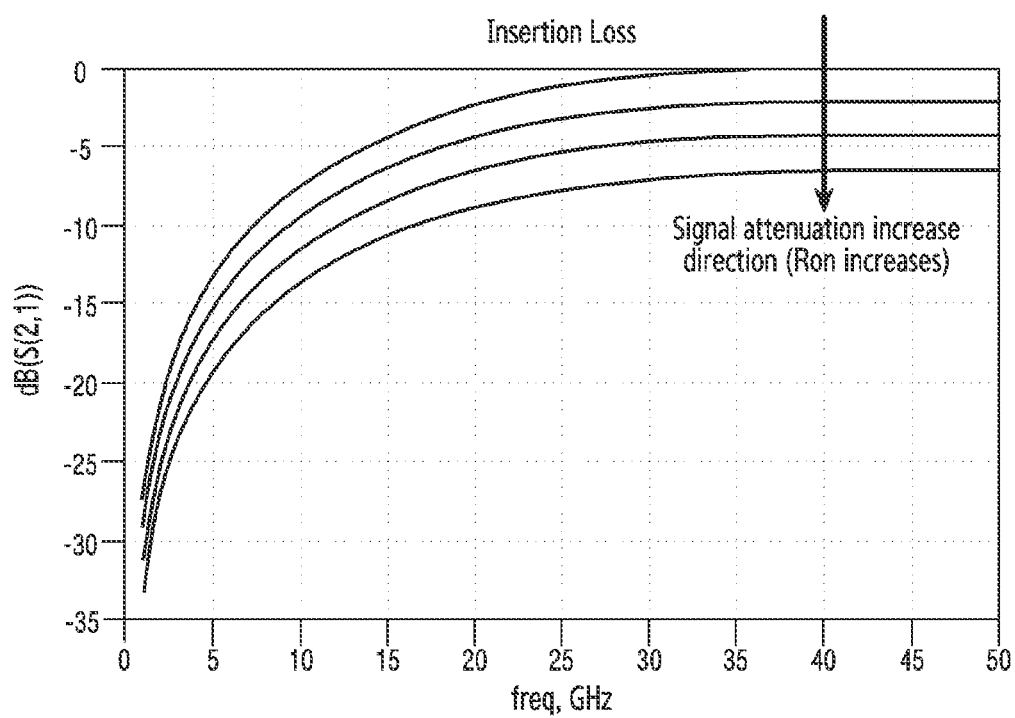
FIG. 11 is a graph illustrating a change in attenuation step for each mode in a signal attenuation device according to various embodiments of the disclosure.

FIG. 11 is a graph illustrating an attenuation step change for each mode in a signal attenuation device according to various embodiments of the disclosure.

Referring to FIG. 11, it may be seen that a signal attenuation device of the disclosure exhibits a uniform change for each step when the signal attenuation occurs according to a change in the impedance value. More specifically, the value $R_{on}$ required for uniform attenuation may be obtained by changing the on/off state of the transistor and configuring an appropriate size of each transistor. Accordingly, it is possible to implement the minimum signal level control step of an MC required for the system. In addition, when transmitting a signal of maximum power, since all transistors are in the on state, nonlinear operation that may be caused by transistors in the off state may be prevented, thereby easily securing linearity.

The methods according to embodiments described in the claims or the specification of the disclosure may be implemented by hardware, software, or a combination of hardware and software.

When the methods are implemented by software, a computer-readable storage medium for storing one or more programs (software modules) may be provided. The one or more programs stored in the computer-readable storage medium may be configured for execution by one or more processors within the electronic device. The at least one program may include instructions that cause the electronic device to perform the methods according to various embodiments of the disclosure as defined by the appended claims and/or disclosed herein.

The programs (software modules or software) may be stored in non-volatile memories including a random access memory and a flash memory, a read only memory (ROM), an electrically erasable programmable read only memory (EEPROM), a magnetic disc storage device, a compact disc-ROM (CD-ROM), digital versatile discs (DVDs), or other type optical storage devices, or a magnetic cassette. Alternatively, any combination of some or all of them may form a memory in which the program is stored. Further, a plurality of such memories may be included in the electronic device.

In addition, the programs may be stored in an attachable storage device which may access the electronic device through communication networks such as the Internet, Intranet, Local Area Network (LAN), Wide LAN (WLAN), and Storage Area Network (SAN) or a combination thereof. Such a storage device may access the electronic device via an external port. Further, a separate storage device on the communication network may access a portable electronic device.

In the above-described detailed embodiments of the disclosure, an element included in the disclosure is expressed in the singular or the plural according to presented detailed embodiments. However, the singular form or plural form is selected appropriately to the presented situation for the convenience of description, and the disclosure is not limited by elements expressed in the singular or the plural, Therefore, either an element expressed in the plural may also include a single element or an element expressed in the singular may also include multiple elements.

Although specific embodiments have been described in the detailed description of the disclosure, various modifications and changes may be made thereto without departing from the scope of the disclosure. Therefore, the scope of the disclosure should not be defined as being limited to the embodiments, but should be defined by the appended claims and equivalents thereof.

The invention claimed is:

1. A signal attenuation device built in a stack-up structure in a radio frequency integrated circuit (RFIC), the signal attenuation device comprising:
    a first transmission line positioned in a first layer in the RFIC;
    a second transmission line positioned in a second layer in the RFIC vertically adjacent to the first layer and electromagnetically coupled to the first transmission line; and
    a controller,
    wherein the first transmission line comprises a first impedance controller on a first end of the first transmission line,
    wherein the second transmission line comprises a second impedance controller on a first end of the second transmission line, and the first end of the second transmission line is opposite to the first end of the first transmission line,
    wherein the controller is coupled with the first impedance controller and the second impedance controller, and configured to control the first impedance controller and the second impedance controller,
    wherein the signal attenuation device further comprises:
        a first signal port through which current is configured to flow in and out at a second end of the first transmission line which is opposite to the first end of the first transmission line; and
        a second port through which current is configured to flow in and out at a second end of the second transmission line which is opposite to the first end of the second transmission line,
    wherein one side of the first impedance controller is grounded and one side of the second impedance controller is grounded,
    wherein each of the first impedance controller and the second impedance controller comprises at least two transistors connected to each other in parallel, respectively,
    wherein the controller is further configured to control an on/off state of each of the at least two transistors of each of the first impedance controller and the second impedance controller, individually, and
    wherein the signal attenuation device is selected by a switch included in the RFIC based on a frequency band.

2. The signal attenuation device according to claim 1, wherein the first impedance controller and the second impedance controller are provided symmetrically in the first transmission line and the second transmission line, respectively.

3. The signal attenuation device according to claim 2, wherein the controller is connected with the symmetrically provided first and second impedance controllers.

4. The signal attenuation device according to claim 3, wherein the controller is further configured to attenuate a magnitude of an induced current flowing through the second transmission line by controlling an impedance value of the second impedance controller.

5. The signal attenuation device according to claim 1, wherein the controller is further configured to control the on/off state of each of the at least two transistors depending on a previously determined attenuation mode.

6. A signal attenuation method, comprising:
    electromagnetically coupling two adjacent layers using a stack-up structure in a radio frequency integrated circuit (RFIC), wherein the two layers are vertically positioned in the RFIC;
    determining an impedance value of each of the two layers depending on a previously determined attenuation mode; and
    controlling the impedance value of each of the two layers,
    wherein the impedance value is determined by switching an on/off state of each of at least two transistors of each of the two layers respectively connected to the two layers, and
    wherein the impedance value of each of the two layers is selected by a switch included in the RFIC based on a frequency band.

* * * * *